United States Patent
Kanbara et al.

(10) Patent No.: US 7,180,356 B2
(45) Date of Patent: Feb. 20, 2007

(54) SEMICONDUCTOR CIRCUIT

(75) Inventors: Minoru Kanbara, Hachioji (JP);
Shinobu Sumi, Tama (JP); Takumi Yamamoto, Fussa (JP)

(73) Assignee: Casio Computer Co., Ltd., Tokyo (JP)

( * ) Notice: Subject to any disclaimer, the term of this patent is extended or adjusted under 35 U.S.C. 154(b) by 91 days.

(21) Appl. No.: 11/018,273

(22) Filed: Dec. 20, 2004

(65) Prior Publication Data
US 2005/0156844 A1 Jul. 21, 2005

(30) Foreign Application Priority Data
Dec. 26, 2003 (JP) ............... 2003-433307

(51) Int. Cl.
*H03L 5/00* (2006.01)
*H03K 17/16* (2006.01)
(52) U.S. Cl. ..................... 327/333; 327/390
(58) Field of Classification Search ............... 327/112, 327/333, 374, 376, 377, 390, 437, 438
See application file for complete search history.

(56) References Cited

U.S. PATENT DOCUMENTS

| | | | | |
|---|---|---|---|---|
| 3,898,479 A * | 8/1975 | Proebsting | .................... | 326/88 |
| 3,987,315 A * | 10/1976 | Matsue | ...................... | 327/212 |
| 4,090,096 A * | 5/1978 | Nagami | ...................... | 327/173 |
| 4,443,720 A * | 4/1984 | Takemae | ...................... | 327/541 |
| 5,694,061 A * | 12/1997 | Morosawa et al. | ......... | 326/119 |
| 5,828,262 A * | 10/1998 | Rees | ........................... | 327/390 |
| 5,949,271 A * | 9/1999 | Fujikura | ..................... | 327/390 |
| 6,677,798 B2 * | 1/2004 | Chang et al. | ............... | 327/333 |
| 6,928,136 B2 * | 8/2005 | Nagao et al. | ............... | 326/119 |
| 2002/0158666 A1* | 10/2002 | Azami et al. | .................. | 326/83 |
| 2003/0020520 A1* | 1/2003 | Miyake et al. | .............. | 327/112 |

FOREIGN PATENT DOCUMENTS

| | | |
|---|---|---|
| JP | 2000-286694 A | 10/2000 |
| JP | 2002-026715 A | 1/2002 |
| JP | 2003-179479 | 6/2003 |

* cited by examiner

*Primary Examiner*—My-Trang Nuton
(74) *Attorney, Agent, or Firm*—Frishauf, Holtz, Goodman & Chick, P.C.

(57) ABSTRACT

The level shift circuit in the semiconductor circuit of the invention has a configuration comprising an input stage inverter circuit which inputs an input signal having a first voltage amplitude and outputs an inverted signal of this input signal, an output stage inverter circuit which inputs at least the output signal of the input stage inverter circuit and the output signal has a second voltage amplitude larger than the first voltage amplitude and a bootstrap circuit section which boosts a voltage value of input signal voltage of the output stage inverter circuit and the potential difference of the input signal and the output signal is held as a voltage component. The level shift circuit of each circuit is a Thin-Film Transistor at least using a semiconductor layer composed of amorphous silicon having single channel polarity as a switching element.

20 Claims, 5 Drawing Sheets

SEMICONDUCTOR CIRCUIT

CROSS-REFERENCE TO RELATED APPLICATION

This application is based upon and claims the benefit of priority from the prior Japanese Patent Application No. 2003-433307, filed Dec. 26, 2003, the entire contents of which is incorporated herein by reference.

BACKGROUND OF THE INVENTION

1. Field of the Invention

The present invention relates to a level shift circuit in a semiconductor circuit configuration comprising a switching element and a signal output circuit comprised with this level shift circuit. More particularly, the present invention relates to a level shift circuit applicable to the outputting segment in the driver circuit formed as a peripheral circuit of an image display device or an image reader and a signal output circuit comprised with this level shift circuit.

2. Description of the Related Art

Conventionally, in the signal output circuit of the outputting segment in the driver circuit formed as a peripheral circuit of an image display device or an image reader, in order to generate driving signal voltage having a predetermined voltage amplitude for driving the drive transistors of the display pixels in an image display device, the photosensors of the reading pixels in an image reader, etc., a level shift circuit is used for transforming the input signal into a driving signal with different voltage amplitudes.

In such a driver circuit, since it corresponds to be formed as one body in the substrate of an Integrated Circuit (IC) chip type drive circuit of a display panel or a sensor panel, a circuit configuration constituted of Thin-Film Transistors (TFTs) can be applied. In such a case, the signal output circuit also includes a level shift circuit and a circuit configuration constituted of TFTs can be applied.

FIG. 5 is an equivalent circuit diagram showing an example configuration of a level shift circuit in the conventional prior art. A level shift circuit in the conventional prior art, for example as shown in FIG. 5, has a circuit configuration (In the drawing, a circuit that connects the input contact of the next stage CMOS inverter with the output contact of the first stage CMOS inverter.) connected in series with the input side of a Complementary Metal Oxide Semiconductor (CMOS) inverter serially connected to each other in the current path of a p-channel type TFT Tp101 and an n-channel type TFT Tn102 and the output side of the CMOS inverter serially connected to each other in the current path of a p-channel TFT Tp103 and an n-channel TFT Tn104 in between a high voltage Vdd supplied from a high potential power supply and a low voltage Vss supplied from a low potential power supply.

In such a level shift circuit, an input signal IN which has a predetermined voltage amplitude is supplied to the input terminal Tin connected in common to each gate terminal of the TFTs Tp101 and Tn102 configured on the input side of the CMOS inverter and an output signal OUT which has a voltage amplitude larger than the above-mentioned input signal IN is outputted from the output terminal Tout provided in the connection contact of the TFTs Tp103 and Tn104 configured on the output side of the CMOS inverter. Here, the voltage amplitude of the output signal OUT can be established randomly by setting appropriately each transistor size (channel size) of the TFTs Tp103 and Tn104 configured on the output side of the CMOS inverter in particular.

Moreover, as a general rule, for each TFT constituting a drive circuit comprised with a signal output circuit including such a level shift circuit, a TFT (hereinafter denoted as a "polysilicon TFT") using a semiconductor layer consisting of polysilicon or a TFT (hereinafter denoted as an "amorphous silicon TFT") using a semiconductor layer consisting of amorphous silicon can be applied.

However, the level shift circuit as shown in the conventional prior art has disadvantages as described in the following.

Namely, when applying the level shift circuit stated above to the signal output circuit of the outputting segment in the drive circuit of an image display device or an image reader, it is necessary to generate drive voltage (driving signal) which has a voltage amplitude relative to the specification of the display pixels (display panel) in the image display device or the reading pixels (sensor panel) in the image reader. For example, because the display pixels or reading pixels are driven depending on the image display device or the image reader, these apparatus need to generate and output a driving signal that has voltage amplitude of about 10V in the level shift circuit of the signal output circuit.

In cases where the configuration of the drive circuit includes a signal output circuit which uses polysilicon TFTs, as "ON" state current is relatively high and electron mobility (electron drift velocity) is relatively high, a signal output circuit having reasonably satisfactory operating speed can be acquired. However, because the withstand voltage of polysilicon TFTs is relatively low in the level shift circuit of the signal output circuit, the voltage amplitude (voltage surge) of 10V mentioned above cannot be tolerated and thereby polysilicon TFTs have a disadvantage in that eventually element breakdown will occur.

On the other hand, in cases where the configuration of the drive circuit includes a signal output circuit which uses amorphous silicon TFTs, since the withstand voltage of amorphous silicon TFTs is relatively high as compared with the case where polysilicon TFTs are used, the apparatus can control the development of element breakdown in relation to the voltage surge of 10V mentioned above in the level shift circuit of the signal output circuit. However, because "ON" state current is low and electron mobility is low as element resistance (channel resistance) is relatively high, amorphous silicon TFTs have a disadvantage in that the operating speed of the signal output circuit is slower.

SUMMARY OF THE INVENTION

The present invention of a level shift circuit configuration having Thin-Film Transistors (TFTs) and a signal output circuit which includes a level shift circuit has an advantage of being able to produce an output signal in which the withstand voltage can be set relatively high for maintaining an appropriate voltage range and suitable operating speed, even if it is the case whereby the generated output signal has a relatively high voltage amplitude.

The level shift circuit in the present invention for acquiring the above-stated advantage transforms and outputs a first signal having a first voltage amplitude to a second signal having a second voltage amplitude larger than the first voltage amplitude comprising Thin-Film Transistors at least using a semiconductor layer composed of amorphous silicon having single channel polarity as a switching element; an input stage inverter circuit which has two input terminals; a first signal is inputted into the input terminal of either side and a reversed phase signal of the first signal is inputted into the input terminal of the other side, whereby an inverted signal of the first signal is generated and outputted; an output stage inverter circuit which has two input terminals and one output terminal, the first signal is inputted into the input terminal of either side and the inverted signal is inputted into the input terminal of the other side, whereby the second signal is generated to the output terminal; and a bootstrap circuit section which boosts a voltage value of a signal voltage inputted into the input terminal of one side of the output stage inverter circuit is set between the input terminal and the output terminal of one side of the output stage inverter circuit and the potential difference of the first signal and the second signal is held as a voltage component.

The input stage inverter circuit comprises a first switching element and a second switching element serially connected in the current path between a first power supply voltage and a second power supply voltage. The first switching element control terminal is connected to the input terminal of the either side and the reversed phase signal of the first signal is inputted; the second switching element control terminal is connected to the input terminal of one direction and the first signal is inputted; and the inverted signal is outputted to the connection contact of the first switching element and the second switching element.

The output stage inverter circuit comprises a third switching element and a fourth switching element serially connected in the current path between the first power supply voltage and the second power supply voltage. The third switching element control terminal is connected to the input terminal of the other side and the first signal is inputted; the fourth switching element control terminal is connected to the input terminal of the either side and the inverted signal is inputted; and a connection contact of the third switching element and the fourth switching element are connected to the output terminal and outputs the output signal.

The bootstrap circuit section comprises a capacitative element which holds the voltage component is set between the third switching element control terminal and the connection contact of the third switching element and the fourth switching element; and a fifth switching element which prevents transfer of the electric charge held in the capacitative element is connected to the third switching element control terminal in one end of the current path. The capacitative element is parasitic capacitance formed between the third switching element control terminal and the connection contact of the third switching element and the fourth switching element. The fifth switching element the first signal is inputted into the other end of the current path and the control terminal is connected to the first power supply voltage.

The signal output circuit in the present invention for acquiring the above-stated advantage generates and outputs an output signal having a predetermined voltage amplitude comprises a signal generation part which generates a first voltage having a first voltage amplitude; a signal output part which transforms and outputs the first signal to the second signal which has a second voltage amplitude larger than the first voltage amplitude; the signal generation part configuration comprises at least Thin-Film Transistors using a semiconductor layer composed of polysilicon as a switching element; the signal output part configuration comprises at least Thin-Film Transistors using a semiconductor layer composed of polysilicon as a switching element; the signal output part comprises an input stage inverter circuit which has two input terminals, the first signal is inputted into the input terminal of either side and a reversed phase signal of the first signal is inputted into the input terminal of the other side, whereby an inverted signal of the first signal is generated and outputted; an output stage inverter circuit which has two input terminals and one output terminal, the first signal is inputted into the input terminal of either side and the inverted signal is inputted into the input terminal of the other side, whereby the second signal is generated to the output terminal; and a bootstrap circuit section which boosts a voltage value of a signal voltage inputted into the input terminal of one side of the output stage inverter circuit is set between the input terminal and the output terminal of one side of the output stage inverter circuit and the potential difference of the first signal and the second signal is held as a voltage component.

The input stage inverter circuit comprises a first switching element and a second switching element serially connected in the current path between a first power supply voltage and a second power supply voltage. The first switching element control terminal is connected to the input terminal of the other side and the reversed phase signal of the first signal is inputted; the second switching element control terminal is connected to the input terminal of the either side and the first signal is inputted; and the inverted signal is outputted to the connection contact of the first switching element and the second switching element.

The output stage inverter circuit comprises a third switching element and a fourth switching element serially connected in the current path between the first power supply voltage and the second power supply voltage. The third switching element control terminal is connected to the input terminal of the other side and the first signal is inputted; the fourth switching element control terminal is connected to the input terminal of the either side and the inverted signal is inputted; and a connection contact of the third switching element and the fourth switching element are connected to the output terminal and outputs the output signal.

In the signal output part, the bootstrap circuit section comprises a capacitative element which holds the voltage component is set between the third switching element control terminal and the connection contact of the third switching element and the fourth switching element; and a fifth switching element which prevents transfer of the electric charge held in the capacitative element is connected to the third switching element control terminal in one end in the current path. The capacitative element, for example, is parasitic capacitance formed between the third switching element control terminal and the connection contact of the third switching element and the fourth switching element. In the fifth switching element, the first signal is inputted into the other end of the current path and the control terminal is connected to the first power supply voltage.

The first power supply voltage is high voltage and the second power supply voltage is low voltage; and the first and second switching elements are Thin-Film Transistors using a semiconductor layer composed of an n-channel type amorphous silicon semiconductor layer, or the first power supply voltage is low voltage and the second power supply voltage is high voltage; and the first and second switching elements are Thin-Film Transistors using a semiconductor layer composed of a p-channel type amorphous silicon semiconductor layer.

The above and further objects and preferred features of the present invention will more fully appear from the following detailed description when the same is read in conjunction with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Figure 1:
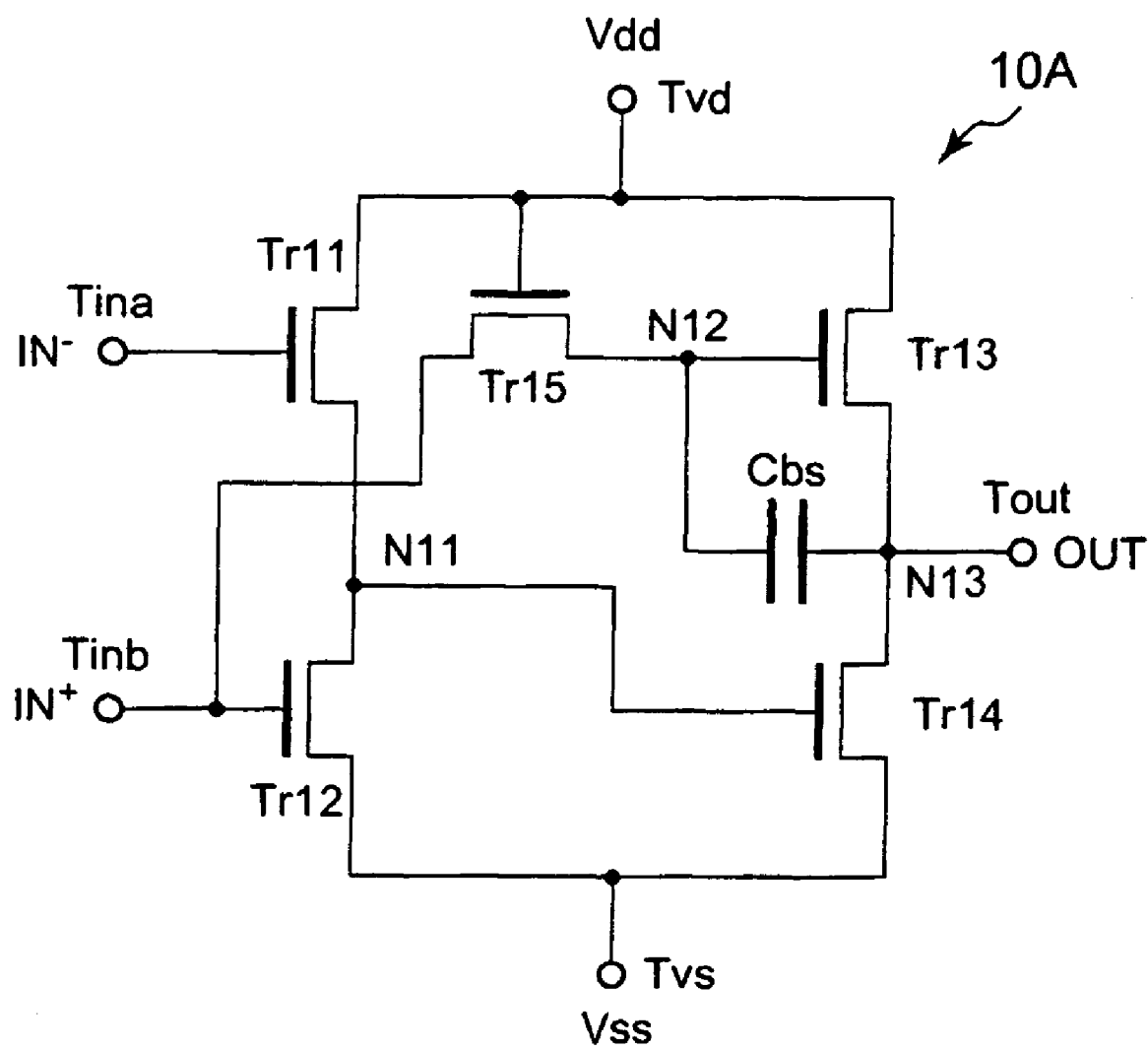
FIG. 1 is an equivalent circuit diagram showing the first embodiment of the level shift circuit related to the present invention.

Hereinafter, the level shift circuit related to the present invention and the signal output circuit comprising this level shift circuit will be explained based on the preferred embodiments shown in the drawings.

<First Embodimen>

FIG. 1 is an equivalent circuit diagram showing the first embodiment of the level shift circuit related to the present invention.

Here, in regard to explanations about any composition equivalent to the level shift circuit shown in the conventional prior art stated above, the equivalent or same nomenclature is appended.

Referring to FIG. 1, a level shift circuit 10A related to the first embodiment, for example, has a configuration comprising an n-channel type Thin-Film Transistor (TFT) Tr11 (hereinafter denoted as "Nch transistor"), an Nch transistor Tr12, an Nch transistor Tr15, an Nch transistor Tr13, an Nch transistor Tr14, and a capacitor Cbs. The Nch transistor Tr11 (first switching element) current path (source-drain terminals) is connected between a voltage terminal Tvd to which a high voltage Vdd (first power supply voltage) is applied and a contact N11, as well as the control terminal (gate terminal) is connected to an input terminal Tina to which a reversed phase signal (input signal IN−) of an input signal IN+ (first signal) is applied. The Nch transistor Tr12 (second switching element) current path is connected between the contact N11 and a voltage terminal Tvs to which low voltage Vss (second power supply voltage) is applied, as well as the control terminal is connected to an input terminal Tinb to which the input signal IN+ is applied. The Nch transistor Tr15 (fifth switching element) current path is connected between the input terminal Tinb and a contact N12, as well as the control terminal is connected to the voltage terminal Tvd. The Nch transistor Tr13 (third switching element) current path is connected between the voltage terminal Tvd and a contact N13 (output terminal Tout), as well as the control terminal is connected to the contact N12. The Nch transistor Tr14 (fourth switching element) current path is connected between the contact N13 and the voltage terminal Tvs, as well as the control terminal is connected to the contact N11. The capacitor Cbs (capacitive element) is connected between the contact N12 and the contact N13. Also, the output terminal Tout is connected to the contact N13.

Accordingly, in the level shift circuit related to the embodiment, the Nch transistors Tr11 and Tr12 are connected in series between the high voltage Vdd and the low voltage Vss. In addition, an input stage inverter circuit configuration is constituted so that the reversed phase signal (input signal IN−) of the input signal IN+ to the Nch transistor Tr11 control terminal and the input signal IN+ to the Nch transistor Tr12 control terminal are applied simultaneously.

Furthermore, the Nch transistors Tr13 and Tr14 are connected in series between the high voltage Vdd and the low voltage Vss. In addition, an output stage inverter circuit configuration is constituted so that the electric potential at contact N12 to the Nch transistor Tr13 control terminal and the electric potential (the output potential of the input stage inverter circuit which constitutes an inverted signal of the input signal IN+; constitutes a reversed phase of the electric potential at the contact N12 to be described later) at the contact N11 to the Nch transistor Tr14 control terminal are applied simultaneously.

Here, each of the Nch transistors Tr11~Tr15 consist of a TFT using a semiconductor layer composed of amorphous silicon for instance and formed on a single insulating substrate.

Next, operation of the level shift circuit which has the above-mentioned circuit configuration will be explained.

Figure 2:
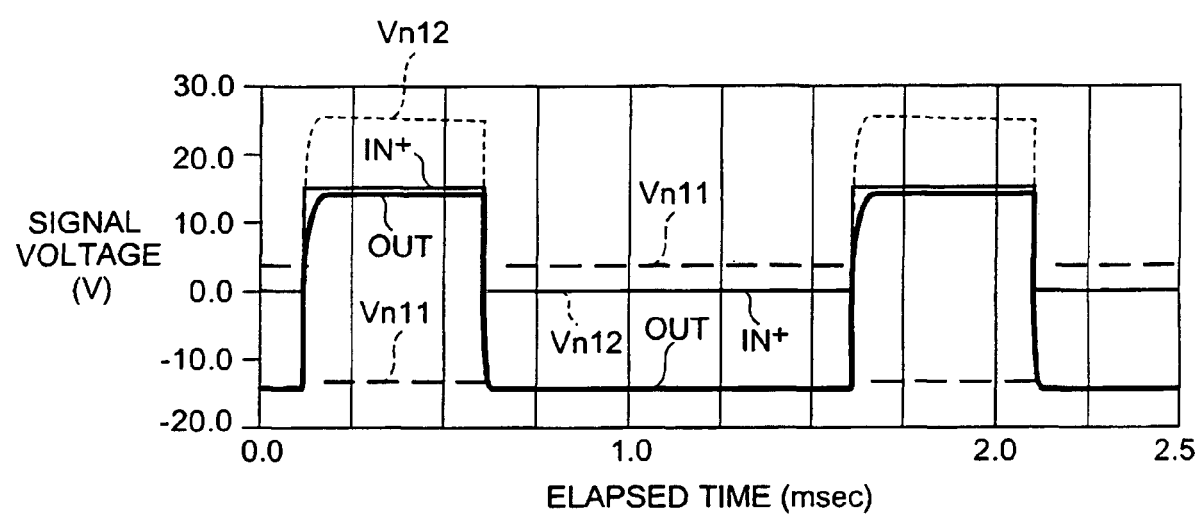
FIG. 2 is a simulation result showing the signal voltage transformation in each terminal and contact of the level shift circuit related to the embodiment.

FIG. 2 is a simulation result showing the signal voltage transformation in each terminal and contact of the level shift circuit related to the embodiment.

Here, in the level shift circuit 10A described above, the high voltage Vdd is set as +15V, the low voltage Vss is set as −18V and a case whereby the input signal IN+ having a voltage amplitude (first voltage amplitude) of 0~15V is transformed and outputted as the output signal OUT (second signal) having a voltage amplitude (second voltage amplitude) of −15V~+15V from the above-stated level shift circuit 10A is explained.

First, as shown in FIG. 2 for explaining the operating characteristic of the input stage inverter circuit, as a high-level (=+15V) of the input signal IN+ is inputted into the input terminal Tinb and a low-level (=0V) of the input signal IN− which constitutes a reversed phase of the input signal IN+ is inputted into the input terminal Tina, the Nch transistor Tr12 of the level shift circuit 10A shown in FIG. 1 performs an "ON" operation and the Nch transistor Tr11 performs an "OFF" operation. As a result, the contact N11 connects to the voltage terminal Tvs (low voltage =−18V) via the Nch transistor Tr12. The electric potential Vn11 becomes high-voltage by the continuity resistance ("ON" resistance) of Nch transistor Tr12 and set as a low-level having sufficiently low signal voltage (−13V generally).

Conversely, as a low-level (=0V) of the input signal IN− is inputted into the input terminal Tinb and a high-level (=+15V) of the input signal IN− which constitutes a reversed phase of the input signal IN+ is inputted into the input terminal Tina, the Nch transistor Tr11 performs an "ON" operation and the Nch transistor Tr12 performs an "OFF" operation. As a result, the contact N11 connects to the voltage terminal Tvd (high voltage =+15V) via the Nch transistor Tr11. The electric potential Vn11 has low voltage by the continuity resistance of the Nch transistor Tr11 and set as a high-level. Here, as for the circuit characteristic of amorphous silicon TFTs, since the continuity resistance of the Nch transistor Tr11 connected to the high voltage Vdd side is relatively high, it is difficult to set this continuity resistance low. As shown in FIG. 2, although the electric potential Vn11 at the contact N11 is high-level only extremely low voltage of about +3~+4V generally is obtained.

Thus, in the level shift circuit 10A shown in FIG. 1, the output voltage (electric potential Vn11 at contact N11) of the input stage inverter circuit (Nch transistors Tr11 and Tr12) has low voltage by the high level side and does not have sufficient voltage amplitude. Consequently, the preferred embodiment described below comprises a configuration which increases the voltage amplitude while generating an output signal that functions in-phase with the input signal by inputting (applying) the output voltage of the input stage inverter circuit into the output stage inverter circuit.

Specifically, in the output stage inverter circuit, once the output voltage (electric potential Vn11 at contact N11) of the above-mentioned input stage inverter circuit becomes a high-level (+3V~+4V generally), the Nch transistor Tr14 performs an "ON" operation and the contact N13 (output terminal Tout) connects to the voltage terminal Tvs (low voltage Vss =−18V) via the Nch transistor Tr14. Although becoming high voltage by the continuity resistance of the Nch transistor Tr14, the electric potential (output signal OUT) is set as the desired signal voltage (−15V being the lower limit side voltage of the desired voltage amplitude −15V~+15V; low-level).

Besides, in the output stage inverter circuit, since the signal voltage of the input signal IN+ is applied to the Nch transistor Tr13 gate terminal (contact N12) via the Nch transistor Tr15 which maintains a predetermined continuity condition by constantly applying the high voltage Vdd (=+15V) to the gate terminal, at the timing (timing that the input signal IN+ becomes a low-level) that the output voltage (electric potential Vn11 at contact N11) of the above-mentioned input stage inverter circuit becomes a high-level, as shown in FIG. 2, the electric potential Vnl2 is set as a low-level of 0V generally. Accordingly, the potential difference generated between the contact N12 and N13 is held as a voltage component in the capacitor Cbs. Here, because transfer of the electric charge stored in the capacitor Cbs is prevented by the continuity resistance of Nch transistor Tr15, the voltage component in relation to the above-stated potential difference is held satisfactorily in the capacitor Cbs.

Next, once the output voltage (electric potential Vn11 at contact N11) of the above-mentioned input stage inverter circuit becomes a low-level (−13V generally) as the Nch transistor Tr14 performs an "OFF" operation, voltage is applied to the gate terminal (contact N12) of the Nch transistor Tr13 based on the input signal IN+ of a high-level (+15V). Thereby, the Nch transistor Tr13 performs an "ON" operation and the contact N13 (output terminal Tout) connects to the voltage terminal Tvd (high voltage Vdd +15V) via the Nch transistor Tr13.

Accordingly, although low voltage is applied by the continuity resistance of the Nch transistor Tr13, the electric potential (output signal OUT) at the contact N13 is accompanied by an upsurge of electric potential at this contact N13. In the Nch transistor Tr13 gate terminal (contact N12), as shown in FIG. 2, the voltage (25~27 V generally) generated by the potential difference corresponding to the voltage component held in the above-mentioned capacitor Cbs is added (bootstrap phenomenon) to the electric potential of the contact N13. Since the Nch transistor Tr13 performs an "ON" operation in a saturated state, sufficiently high signal voltage (Namely, +13V~+14V approximate to the upper limit side voltage of the desired voltage amplitude −15V~+15V; high-level) approximate to the high voltage Vdd (=+15V) is obtained as the output signal OUT.

In this manner, the configuration of the level shift circuit related to the embodiment employs n-channel type amorphous silicon TFTs with two stages of inverter circuits. Further, the configuration boosts the signal voltage (high-level) of the side applied to the output stage inverter circuit using a bootstrap circuit portion (Nch transistor Tr15 and capacitor Cbs). Even if it is the case that the signal voltage of the high-level side output from the input stage inverter circuit is low, the signal voltage on the high-level side outputted from the output stage inverter circuit can be made sufficiently high. Here, since the all of the amorphous silicon TFTs in the configuration have high withstand voltage, each of the Nch transistors Tr11~Tr15 can generate and output satisfactorily without producing element breakdown even if the output signal has a voltage amplitude (voltage surge) of 10V.

Correspondingly, a level shift configuration using such amorphous silicon TFTs, for example, in the initial stage of the signal generation circuit by connecting as the output stage (signal output part) with the latter stage of the signal generation circuit configuration (for example, a signal generating part, a shift register circuit, etc.) using polysilicon TFTs, the signal generation operation can be rapidly executed as element resistance of polysilicon TFTs is relatively low. On the other hand, in the latter level shift circuit with amorphous silicon transistors, an output signal having relatively high voltage amplitude (10V) with a high withstand characteristic is satisfactorily generable. Furthermore, while having collectively suitable operating speed, a signal output circuit which can output an output signal having the appropriate voltage range without producing element breakdown is achievable.

Figure 3:
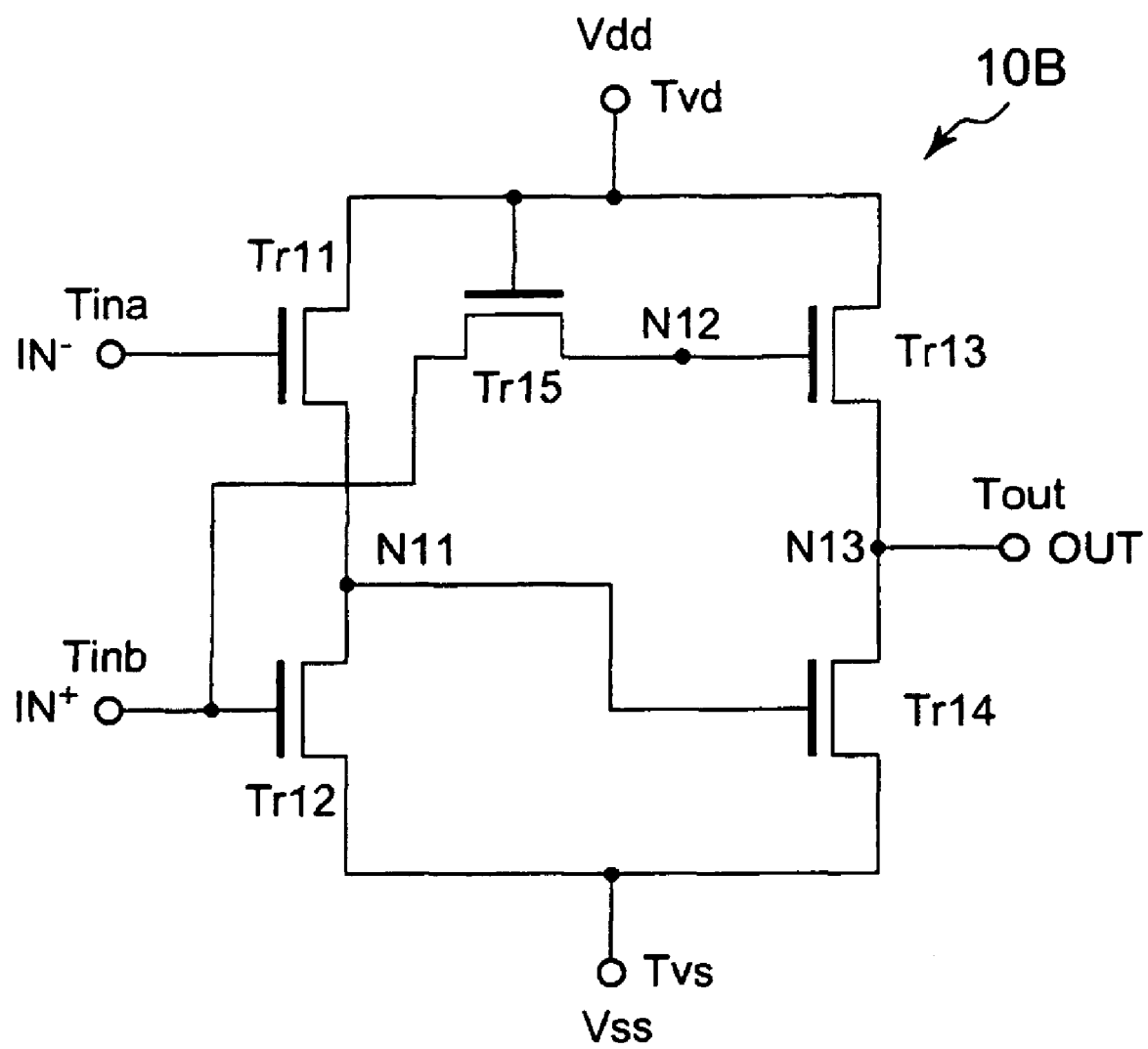
FIG. 3 is an equivalent circuit diagram showing another circuit configuration example of the level shift circuit related to the first embodiment.

FIG. 3 is an equivalent circuit diagram showing another circuit configuration example of the level shift circuit related to the first embodiment.

Here, explanation is omitted concerning any configuration equivalent to the level shift circuit (FIG. 1) mentioned above.

In the embodiment stated above pertaining to the output stage inverter circuit (Nch transistors Tr13 and Tr14), although a configuration with the capacitor Cbs that forms the bootstrap circuit described between the Nch transistor Tr13 gate terminal (contact N12) and the output terminal Tout (contact N13) to which the high voltage Vdd is applied, in the example configuration shown in FIG. 3, the circuit configuration excludes the capacitor Cbs.

Accordingly, if in the event that the transistor size (channel width) of the Nch transistor Tr13 is designed to be larger in order to elevate the drive capability of the level shift circuit 10B (Namely, the capability for generating loads (for example, the display pixels and the reading pixels described in the conventional prior art) supplied to the output signal OUT generated by the level shift circuit), a parasitic capacitance Cgs formed between the Nch transistor Tr13 gate-source also becomes larger. In the event that this parasitic capacitance Cgs has a capacitance value that is a certain amount higher, it will have an equivalent function that to the capacitor Cbs illustrated in the embodiment mentioned above. Even if a circuit configuration excludes the capacitor Cbs, the operational effect equivalent to the embodiment mentioned above can be obtained.

<Second Embodiment>

Next, the second embodiment of the level shift circuit related to the present invention will be explained.

Figure 4A:
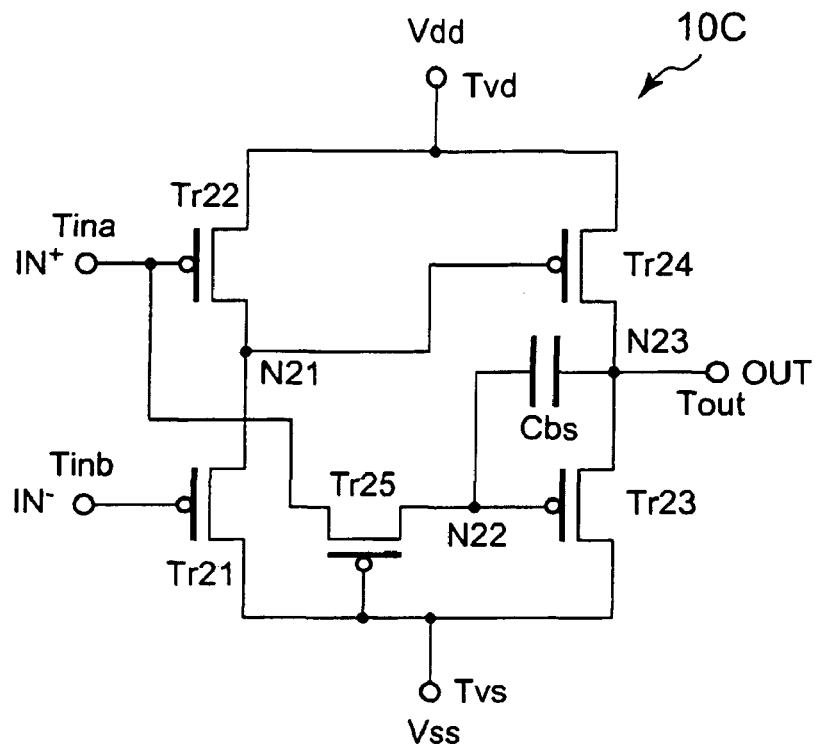
FIGS. 4A and 4B are equivalent circuit diagrams showing the second embodiment of the level shift circuit related to the present invention.
Figure 4B:
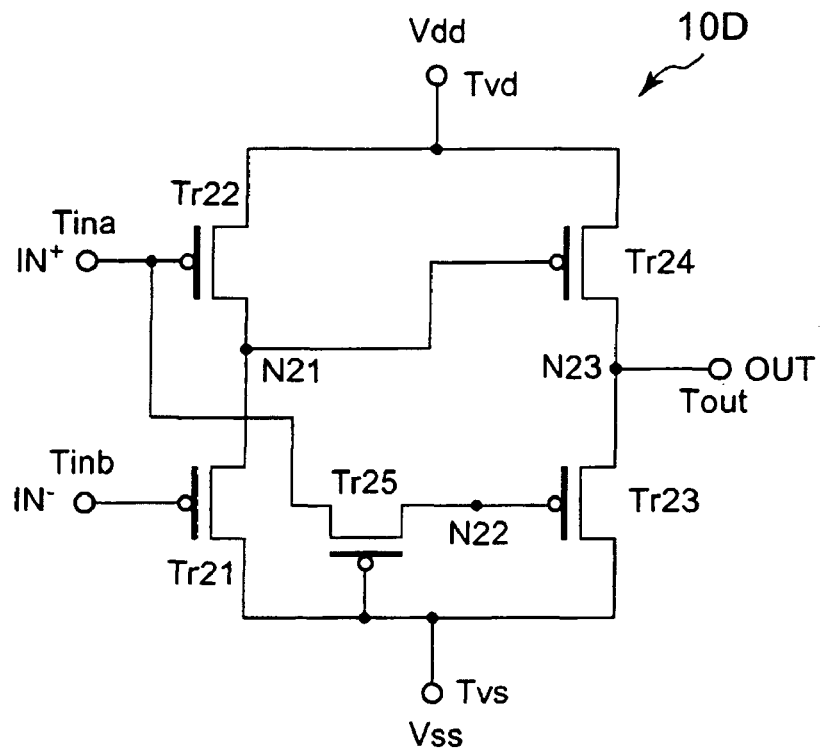
Figure 5:
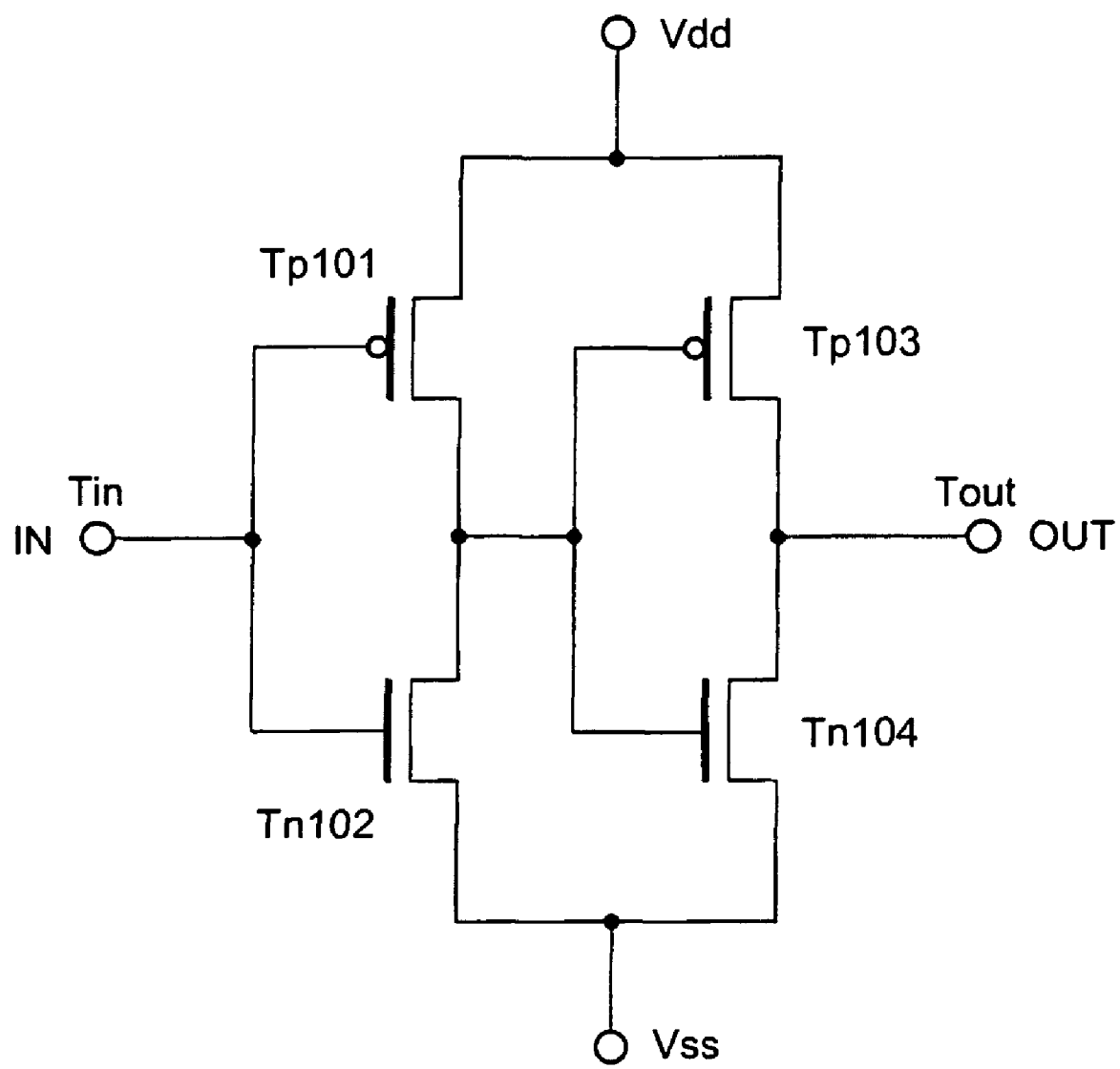
FIG. 5 is an equivalent circuit diagram showing an example configuration of a level shift circuit in the conventional prior art.

FIGS. 4A and 4B are equivalent circuit diagrams showing the second embodiment of the level shift circuit related to the present invention.

Here, concerning any configuration equivalent to the level shift circuits (FIG. 1, FIG. 3) mentioned above, the equivalent or same nomenclature is appended and the explanation is simplified or omitted.

Although a case in which the level shift circuit configuration using n-channel type amorphous silicon TFTs is explained in the first embodiment mentioned above, in this embodiment the circuit configuration uses p-channel type amorphous silicon transistors (hereinafter denoted as "Pch transistor").

Accordingly, as shown in FIG. 4A, the level shift circuit 10C related to this embodiment, the input stage and output stage inverter circuits are set in parallel between the voltage terminals Tvd and Tvs to which the high voltage Vdd (second power supply voltage) and the low voltage Vss (first power supply voltage) is supplied, as well as having a configuration in which each of the Pch transistors Tr22, Tr21, Tr24 and Tr23 are connected in series. Also, between the input stage and output stage inverter circuits, there is a configuration in which the Pch transistor Tr25 and the capacitor Cbs are connected which constitutes a bootstrap circuit.

Here, similar to the case described above in the first embodiment, the transistor size of the Pch transistor Tr23 in the configuration of the output stage inverter circuit is higher. In cases where having a predetermined capacity between gate-source (parasitic capacitance), a circuit configuration which excludes the capacitor Cbs can also be applied such as the level shift circuit 10D shown in FIG. 4B.

Therefore, in the level shift circuit related to this embodiment, although the polarity of the TFTs in the level shift circuits (FIG. 1 and FIG. 3) shown in the embodiment mentioned above is reverse, because a connected state of the voltage terminals Tvd and Tvs is also reverse, a signal voltage characteristic equivalent to FIG. 2 is achievable.

Moreover, the level shift circuit related to the present invention and the signal output circuit comprising this level shift circuit which operates based on an output signal for generating and outputting loads (display pixels, reading pixels, etc.) is not specifically limited to this. In conclusion, what is necessary is the circuit merely has to operate by a driving signal (output signal) which has relatively high voltage amplitude in the range of about 10V, for example, one that can be satisfactorily applied to drive controlling photosensors having what is termed as a double-gate type TFT structure with the upper part of the semiconductor layer (channel layer) composed of amorphous silicon formed on a single insulating substrate and the individual gate electrode formed in the lower part.

While the present invention has been described with reference to the preferred embodiments, it is intended that the invention be not limited by any of the details of the description therein but includes all the embodiments which fall within the scope of the appended claims.

What is claimed is:

1. A level shift circuit formed with a thin-film transistor having a semiconductor layer composed of amorphous silicon having single channel polarity as a switching element, which transforms and outputs a first signal having a first voltage amplitude to a second signal having a second voltage amplitude larger than the first voltage amplitude comprising:

an input stage inverter circuit for generating and outputting an inverted signal of the first signal and which has a first input terminal into which the first signal is inputted and a second input terminal into which a reversed phase signal of the first signal is inputted;

an output stage inverter circuit which has a first input terminal into which a signal based on the first signal is inputted, a second input terminal into which the inverted signal is inputted, and an output terminal which generates and outputs the second signal; and a bootstrap circuit section comprising: (i) boosting means for boosting a voltage value of a signal voltage inputted into the first input terminal of the output stage inverter circuit which is set between the first input terminal and the output terminal of the output stage inverter circuit and which holds an electronic charge corresponding to a potential difference of the first signal and the second signal, and (ii) a switching element which prevents transport of the electric charge held in the boosting means while connecting a first end of a current path to the first input terminal of the input stage inverter circuit, inputting the first signal into a second end of the current path and impressing the first signal to the first input terminal of the output stage inverter circuit via the current path.

2. The level shift circuit according to claim 1, wherein the input stage inverter circuit comprises:

a first switching element and a second switching element serially connected in a current path between a first power supply voltage and a second power supply voltage;

wherein a control terminal of the first switching element is connected to the second input terminal, to which the reversed phase signal of the first signal is inputted, and a control terminal of the second switching element is connected to the first input terminal, to which the first signal is inputted; and wherein the inverted signal is outputted to a connection contact of the first switching element and the second switching element.

3. The level shift circuit according to claim 2, wherein the first power supply voltage is high voltage and the second power supply voltage is low voltage; and wherein the first and second switching elements are Thin-Film Transistors using a semiconductor layer composed of an n-channel type amorphous silicon semiconductor layer.

4. The level shift circuit according to claim 2, wherein the first power supply voltage is low voltage and the second power supply voltage is high voltage; and wherein the first and second switching elements are Thin-Film Transistors using a semiconductor layer composed of a p-channel type amorphous silicon semiconductor layer.

5. The level shift circuit according to claim 1, wherein the output stage inverter circuit comprises:

a third switching element and a fourth switching element serially connected in a current path between a first power supply voltage and a second power supply voltage;

wherein a control terminal of the third switching element is connected to the first input terminal, to which the signal based on the first signal is inputted, and a control terminal of the fourth switching element is connected to the second input terminal, to which the inverted signal is inputted; and wherein a connection contact of the third switching element and the fourth switching element is connected to the output terminal and outputs the output signal.

6. The level shift circuit according to claim 5, wherein the boosting means comprises a capacitative element which holds the voltage component and which is set between the control terminal of the third switching element and the connection contact of the third switching element and the fourth switching element; and wherein said switching element which prevents transport of the electric charge comprises a fifth switching element which prevents transfer of the electric charge held in the capacitative element and which is connected to the third switching element control terminal at the first end of the current path of said switching element which prevents transport of the electric charge.

7. The level shift circuit according to claim 6, wherein the capacitative element is parasitic capacitance formed between the control terminal of the third switching element and the connection contact of the third switching element and the fourth switching element.

8. The level shift circuit according to claim 6, wherein a control terminal of the fifth switching element is connected to the first power supply voltage.

9. The level shift circuit according to claim 6, wherein the first power supply voltage is high voltage and the second power supply voltage is low voltage; and wherein the third, fourth and fifth switching elements are Thin-Film Transistors using a semiconductor layer composed of n-channel type amorphous silicon.

10. The level shift circuit according to claim 6, wherein the first power supply voltage is low voltage and the second power supply voltage is high voltage; and wherein the third, fourth and fifth switching elements are Thin-Film Transistors using a semiconductor layer composed of p-channel type amorphous silicon.

11. A signal output circuit which generates and outputs an output signal having a predetermined voltage amplitude comprises:

a signal generation part which generates a first having a first voltage amplitude configured with a thin-film transistor using a semiconductor layer composed of at least polysilicon as a switching element;

a signal output part which transforms and outputs the first signal to the second signal which has a second voltage amplitude larger than the first voltage amplitude configured with a plurality of thin-film transistors using a semiconductor layer composed of amorphous silicon which has single channel polarity as switching elements;

wherein the signal output part comprises:

an input stage inverter circuit which generates and outputs an inverted signal of the first signal and which has a first input terminal into which the first signal is inputted and a second input terminal into which a reversed phase signal of the first signal is inputted;

an output stage inverter circuit which has a first input terminal into which a signal based on the first signal is inputted, a second input terminal into which the inverted signal is inputted, and an output terminal which generates and outputs the second signal; and a bootstrap circuit section comprising: (i) boosting means for boosting a voltage value of a signal voltage inputted into the first input terminal of the output stage inverter circuit which is set between the first input terminal and the output terminal of the output stage inverter circuit and which holds an electronic charge corresponding to a potential difference of the first signal and the second signal, and (ii) a switching element which prevents transport of the electric charge held in the boosting means while connecting a first end of a current path to the first input terminal of the input stage inverter circuit, inputting the first signal into a second end of the current path and impressing the first signal to the first input terminal of the output stage inverter circuit via the current path.

12. The signal output circuit according to claim 11, wherein the input stage inverter circuit comprises:

a first switching element and a second switching element serially connected in a current path between a first power supply voltage and a second power supply voltage;

wherein a control terminal of the first switching element is connected to the second input terminal, to which the reversed phase signal of the first signal is inputted, and a control terminal of the second switching element is connected to the first input terminal, to which the first signal is inputted; and wherein the inverted signal is outputted to a connection contact of the first switching element and the second switching element.

13. The signal output circuit according to claim 12, wherein the first power supply voltage is high voltage and the second power supply voltage is low voltage; and wherein the first and second switching elements are Thin-Film Transistors using a semiconductor layer composed of n-channel type amorphous silicon.

14. The signal output circuit according to claim 12, wherein the first power supply voltage is low voltage and the second power supply voltage is high voltage; and wherein the first and second switching elements are Thin-Film Transistors using a semiconductor layer composed of p-channel type amorphous silicon.

15. The signal output circuit according to claim 11, wherein the output stage inverter circuit comprises:

a third switching element and a fourth switching element serially connected in a current path between a first power supply voltage and a second power supply voltage;

wherein a control terminal of the third switching element is connected to the first input terminal, to which the signal based on the first signal is inputted, and a control terminal of the fourth switching element is connected to the second input terminal, to which the inverted signal is inputted; and wherein a connection contact of the third switching element and the fourth switching element is connected to the output terminal and outputs the output signal.

16. The signal output circuit according to claim 15, wherein the boosting means comprises a capacitative element which holds the voltage component and which is set between the control terminal of the third switching element and the connection contact of the third switching element and the fourth switching element; and wherein said switching element which prevents transport of the electric charge comprises a fifth switching element which prevents transfer of the electric charge held in the capacitative element and which is connected to the third switching element control terminal at the first end of the current path of said switching element which prevents transport of the electric charge.

17. The signal output circuit according to claim 16, wherein the capacitative element is parasitic capacitance formed between the control terminal of the third switching element and the connection contact of the third switching element and the fourth switching element.

18. The signal output circuit according to claim 16, wherein a control terminal of the fifth switching element is connected to the first power supply voltage.

19. The signal output circuit according to claim 16, wherein the first power supply voltage is high voltage and the second power supply voltage is low voltage; and wherein the third, fourth and fifth switching elements are Thin-Film Transistors using a semiconductor layer composed of n-channel type amorphous silicon.

20. The level shift circuit according to claim 16, wherein the first power supply voltage is low voltage and the second power supply voltage is high voltage; and wherein the third, fourth and fifth switching elements are Thin-Film Transistors using a semiconductor layer composed of p-channel type amorphous silicon.

* * * * *